United States Patent
Holzmann

(10) Patent No.: US 9,973,178 B1
(45) Date of Patent: May 15, 2018

(54) METHOD AND APPARATUS FOR CLOCK FREQUENCY MULTIPLIER

(71) Applicant: Nuvoton Technology Corporation, Hsinchu (TW)

(72) Inventor: Peter J. Holzmann, San Jose, CA (US)

(73) Assignee: Nuvoton Technology Corporation, Hsinchu (TW)

( * ) Notice: Subject to any disclaimer, the term of this patent is extended or adjusted under 35 U.S.C. 154(b) by 0 days. days.

(21) Appl. No.: 15/434,798

(22) Filed: Feb. 16, 2017

(51) Int. Cl.
  *H01H 83/00* (2006.01)
  *H03K 5/00* (2006.01)
  *G04F 10/00* (2006.01)
  *H03K 5/134* (2014.01)

(52) U.S. Cl.
  CPC ....... *H03K 5/00006* (2013.01); *G04F 10/005* (2013.01); *H03K 5/134* (2014.07); *H03K 2005/00058* (2013.01)

(58) Field of Classification Search
  None
  See application file for complete search history.

(56) References Cited

U.S. PATENT DOCUMENTS

| | | | | |
|---|---|---|---|---|
| 7,978,111 B2* | 7/2011 | Sun | ...... | G04F 10/005 327/1 |
| 9,628,089 B1* | 4/2017 | Jain | ...... | H03L 7/0802 |
| 2010/0171530 A1* | 7/2010 | Deppe | ...... | G04F 10/10 327/102 |
| 2013/0293281 A1* | 11/2013 | Baumann | ...... | G06F 1/305 327/419 |
| 2015/0365076 A1* | 12/2015 | Bansal | ...... | H03K 3/012 327/269 |
| 2017/0063387 A1* | 3/2017 | Gao | ...... | H03B 5/1228 |

* cited by examiner

*Primary Examiner* — Lincoln Donovan
*Assistant Examiner* — Khareem E Almo
(74) *Attorney, Agent, or Firm* — Kilpatrick Townsend & Stockton LLP

(57) ABSTRACT

In a clock frequency doubler, an input clock feeds into a digital programmable delay circuit, and an inverted input clock feeds into another digital programmable delay. The outputs of these digital programmable delay circuits are combined with the input clock and inverse clock through AND gates in order to generate clock pulses at both the rising and falling edge of the clock. These signals are combined using an OR gate to provide an output clock signal with a frequency that is double the frequency of the input clock signal. The values of the control bits for the digital programmable delay circuit are determined in a time-to-digital conversion (TDC) circuit that includes a Successive Approximation Register (SAR). For every cycle of the clock, the SAR circuit successively sets the programmable delay control bits and compares the delay circuit output with the input clock to determine the value of the control bits.

24 Claims, 12 Drawing Sheets

US 9,973,178 B1

METHOD AND APPARATUS FOR CLOCK FREQUENCY MULTIPLIER

BACKGROUND OF THE INVENTION

This invention relates to the field of semiconductor circuit technologies. More particularly, embodiments of this invention are directed to clock frequency multiplier circuits.

Electronic systems on printed circuit boards (PCB) often have limitations on the maximum allowable clock frequencies due to EMI concerns and signal coupling and trace lengths of the PCB connections. However, integrated circuits used on the electronic systems require increasingly faster clocks for signal processing and computation. In order to create a faster clock from a system clock, clock doublers are often used. In some of these systems, such as systems using a SoundWire interface, the clock frequency may be the same as the data rate. In that case, a clock doubler is required for data recovery.

Conventional clock frequency doubling circuits often use phase locked loop (PLL) or frequency locked loop (FLL) circuits. An alternative conventional design to create a clock with a double frequency of the input is to generate pulses on both the positive and negative going edges of the input clock. However, these conventional techniques have limitations that make them unsuitable for certain applications, as described further below.

Therefore, an improved clock frequency multiplier that addresses some of the limitations of conventional circuits is desired.

BRIEF SUMMARY OF THE INVENTION

This invention relates to the field of semiconductor circuit technologies. More particularly, embodiments of this invention are directed to clock frequency multiplier circuits. Conventional clock frequency doubling circuits often use phase locked loop (PLL) or frequency locked loop (FLL) circuits. However, these circuits tend to require large chip areas and have high power consumption. An alternative conventional design to create a clock with a double frequency of the input is to generate pulses on both the positive and negative going edges of the input clock. However, as the input frequency is unknown, the width of these pulses is undetermined. Therefore, it is difficult to control the duty cycle of the generated clock pulse signals.

Embodiments of the invention provide circuits and methods for clock frequency doubling and multiplying, which can be implemented without the disadvantages of large chip areas and high power consumption of phase locked loop (PLL) or frequency locked loop (FLL) circuits. In order to meet close timing requirements in some digital integrated circuits, it is important to use a clock that has close to 50% duty cycle. For audio systems the duty cycle of the clock may be of importance as well as a clock with an incorrect duty cycle can contribute to audio distortion. In some embodiments, the clock frequency doubler or multiplier are configured to provide a 50% duty cycle clock for a wide range of input frequencies. In the description below, the term "clock frequency doubler" and "clock frequency doubling circuit" are used interchangeably.

In some embodiments of the invention, the input clock feeds into a digital programmable delay circuit, and an inverted input clock feeds into another digital programmable delay. The outputs of these digitally programmable delays are combined with the input clock and inverse clock through AND gates in order to generate clock pulses at both the rising and falling edge of the clock. After combining these using an OR gate the output clock signal will have a frequency that is double the frequency of the input clock and synchronous with the input clock signal.

In some embodiments, in order to generate pulses for a 50% duty cycle, the values of the control bits for the digital programmable delay circuit is determined in a time-to-digital conversion circuit that includes an A Successive Approximation Register Time to Digital Converter (SAR TDC). For every cycle of the clock, the SAR circuit successively sets the programmable delay control bits and compares the delay circuit output with the input clock to determine if a control bit should be set to a logic "1" or a logic "0". After the values of all the control bits are determined, the delay time of the digital programmable delay circuit will be approximately equal to the period of the input clock within an accuracy of the least significant bit of the control bits or the unit delay element in the digital programmable delay circuit.

According to some embodiments, a digital pulse generation circuit includes a pulse generator for receiving an input node for receiving an input clock signal having a clock frequency Freq and a clock period Tclock_in. The pulse generator includes a digital programmable delay circuit having a plurality of control bits to provide a delay time that is a preset fraction of the input clock signal. The digital pulse generation circuit also includes a successive approximation register (SAR) for determining values of the plurality of control bits.

According to some embodiments, a clock frequency doubler includes an input node for receiving an input clock signal having a clock frequency Freq and a clock period Tclock, and an inverter coupled to the input node for providing an inverse clock signal. The clock frequency doubler also includes a first digital programmable delay circuit coupled to the input terminal for providing a delayed clock signal and a second digital programmable delay circuit coupled to the inverter for providing a delayed inverse clock signal. A first AND gate receives the delayed clock signal and the inverse clock signal, and outputs a first pulse signal. A second AND gate receives the input clock signal and the delayed inverse clock signal, and outputs a second pulse signal. An OR gate receives the first pulse signal and the second pulse signal and outputs an output clock signal. Each of the first and second digital programmable delay circuit includes N+1 delay elements and N+1 control bits configured for controlling the N+1 delay elements, where N is an integer. The N+1 control bits are configured to match the delay time of the digital programmable delay circuit to a preset fraction of the clock period Tclock_in.

According to some embodiments, a time-to-digital converter (TDC) includes an input node for receiving an input digital signal having and a period T, an inverter coupled to the input node for providing an inverse clock signal, and a digital programmable delay circuit. The digital programmable delay circuit includes N+1 delay elements, numbered #0, #1, #2, #3, . . . , and #N, respectively, where N is an integer. Delay elements #0, #1, #2, #3, . . . , and #N are configured to provide a time delay of 20×Td, 21×Td, 22×Td, 23×Td, . . . , and 2N×Td, respectively, wherein Td is a preset delay time. The TDC also includes a successive approximation register (SAR) coupled to the digital programmable delay circuit, the SAR including N+1 bits, labeled B[0], [B[1], B[2], B[3], . . . , B[N], respectively. Each of the N+1 delay element is selected by a respective bit in the successive approximation register (SAR) B[0], [B[1], B[2], B[3], . . . , B[N], wherein B[0] is the least significant bit and B[N] is the most significant bit of the SAR. The SAR is configured to adjust the bits in the SAR by successive approximation to match the delay time of the digital programmable delay circuit to the period T of the input pulse signal to within a least significant bit of the SAR.

According to some embodiments, a time-to-digital converter (TDC) includes a digital programmable delay circuit, which includes N+1 delay elements, numbered #0, #1, #2, #3, . . . and #N, respectively, wherein N is an integer. The TDC also includes a successive approximation register (SAR) coupled to the digital programmable delay circuit, the SAR including N+1 bits, labeled B[0], [B[1], B[2], B[3], . . . , and B[N], respectively. Each of the N+1 delay element is selected by a respective bit in the successive approximation register (SAR) B[0], [B[1], B[2], B[3], . . . , B[N], wherein B[0] is the least significant bit and B[N] is the most significant bit of the SAR. The time-to-digital converter is configured to adjust the bits in the SAR by successive approximation to match the delay time of the digital programmable delay circuit to the width of the input pulse signal to within a least significant bit of the SAR.

A further understanding of the nature and advantages of the present invention may be realized by reference to the remaining portions of the specification and the drawings.

DETAILED DESCRIPTION OF THE INVENTION

Figure 1:
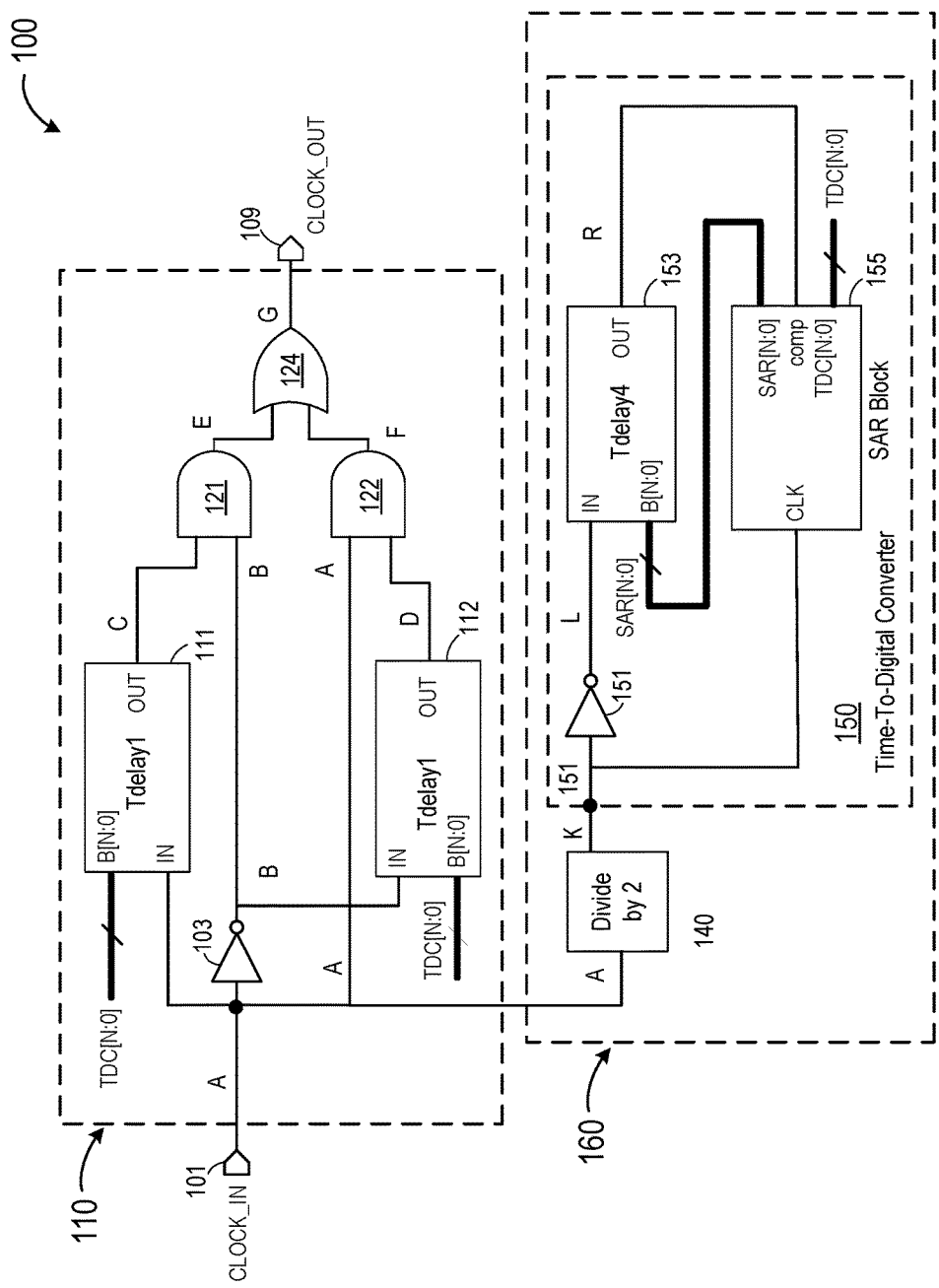
FIG. 1 is a schematic diagram illustrating a clock frequency doubler according to some embodiments of the present invention.

FIG. 1 is a schematic diagram illustrating a clock frequency doubling circuit according to some embodiments of the present invention. As shown in FIG. 1, clock frequency doubling circuit 100 includes a digital pulse generator or clock frequency doubler 100 and a clock period to digital converter 160. Digital pulse generator 110 includes an input node 101 for receiving an input clock signal CLOCK_IN (A) having a clock frequency Freq and a clock period Tclock. An inverter 103 is coupled to the input node for providing an inverse clock signal (B). A first digital programmable delay circuit 111 is coupled to the input terminal for providing a delayed clock signal (C), and a second digital programmable delay circuit 112 is coupled to the inverter for providing a delayed inverse clock signal (D). Clock frequency doubler 100 also includes a first AND gate 121 for receiving the delayed clock signal (C) and the inverse clock signal (B). The first AND gate outputs a first pulse signal (E). Clock frequency doubler 100 also includes a second AND gate 122 for receiving the input clock signal (A) and the delayed inverse clock signal (D). The second AND gate outputs a second pulse signal (F). Further, an OR gate 124 receives the first pulse signal (E) and the second pulse signal (F), and outputs an output clock signal 109 (CLOCK OUT).

Figure 2:
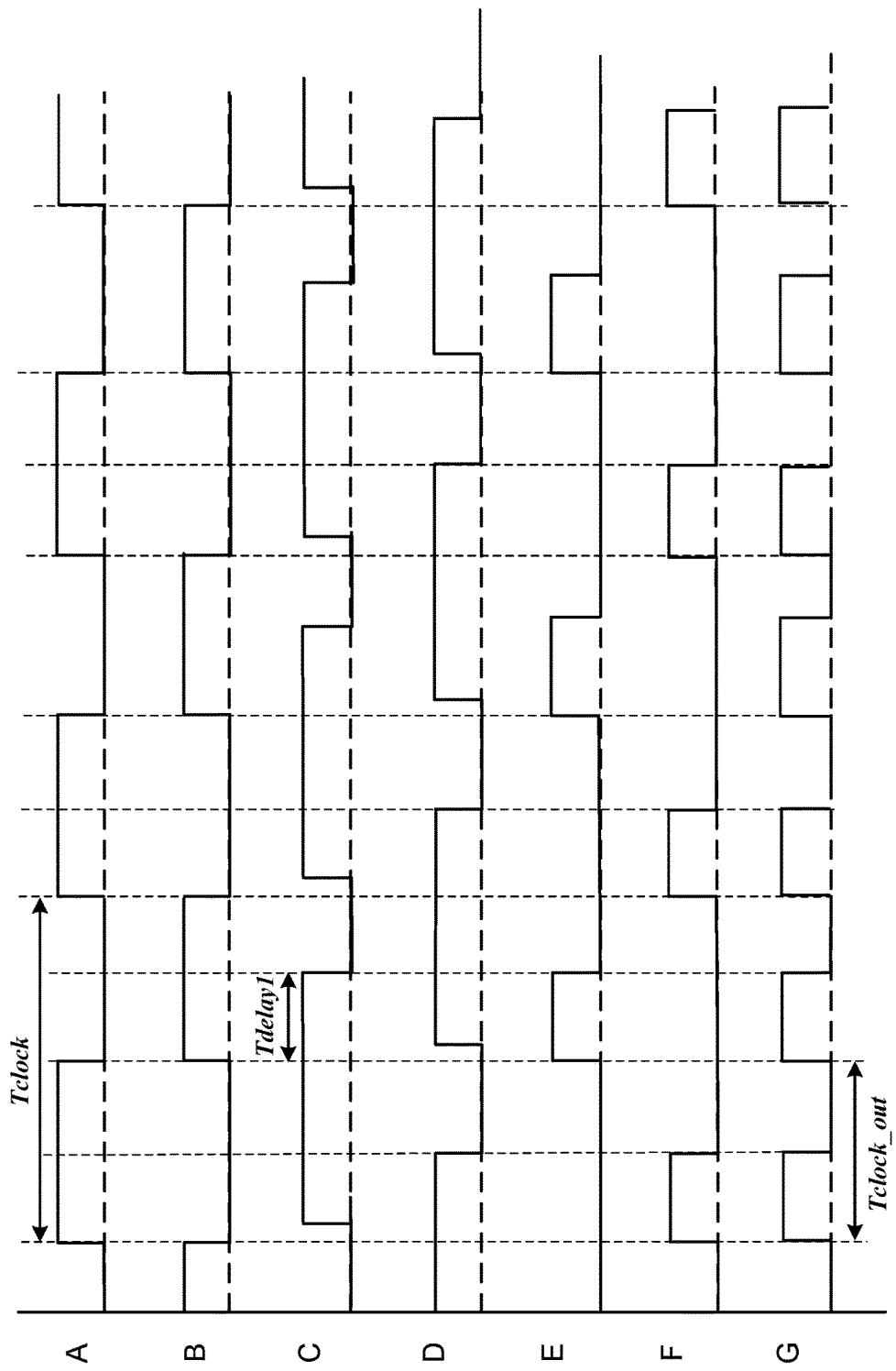
FIG. 2 is a timing diagram illustrating waveforms of various signals in the clock frequency doubler of FIG. 1 according to some embodiments of the present invention.

FIG. 2 is a timing diagram illustrating waveforms of various signals in the clock frequency doubler of FIG. 1 according to some embodiments of the present invention. The operation of clock frequency doubler 100 is explained with reference to the waveforms in FIG. 2. In FIG. 1, the input clock CLOCK_IN (A) feeds into a programmable delay block 111, which provides a delayed clock signal (C) with a delay time Tdelay1, and the inverted input clock (B) feeds into programmable delay block 112, which provides a delayed inverted clock signal (D) after a delay time Tdelay1. The outputs of these digitally programmable delay blocks 111 and 112, (C) and (D), are combined with the input clock signals (B) and (A) through AND gates 121 and 122 in order to generate clock pulses at both the rising and falling edge of the input clock (E) and (F). In some embodiments, digital programmable delay circuits 111 and 112 are configured to provide a delay time Tdelay1 that is equal to one fourth of the clock period Tclock. The time delays provided by digital programmable delay circuits 111 and 112 are determined by parameters TDC[N:0] provided by a clock period to digital converter 160, whose operation is described in detail below.

As illustrated in the timing diagram of FIG. 2, after combining these signals using OR gate 124, the output CLOCK_OUT (G) will have a period Tclock_out that is half of the input clock period Tclock, and a frequency that is double the frequency Freq of the input clock and synchronous to the input clock.

Figure 3:
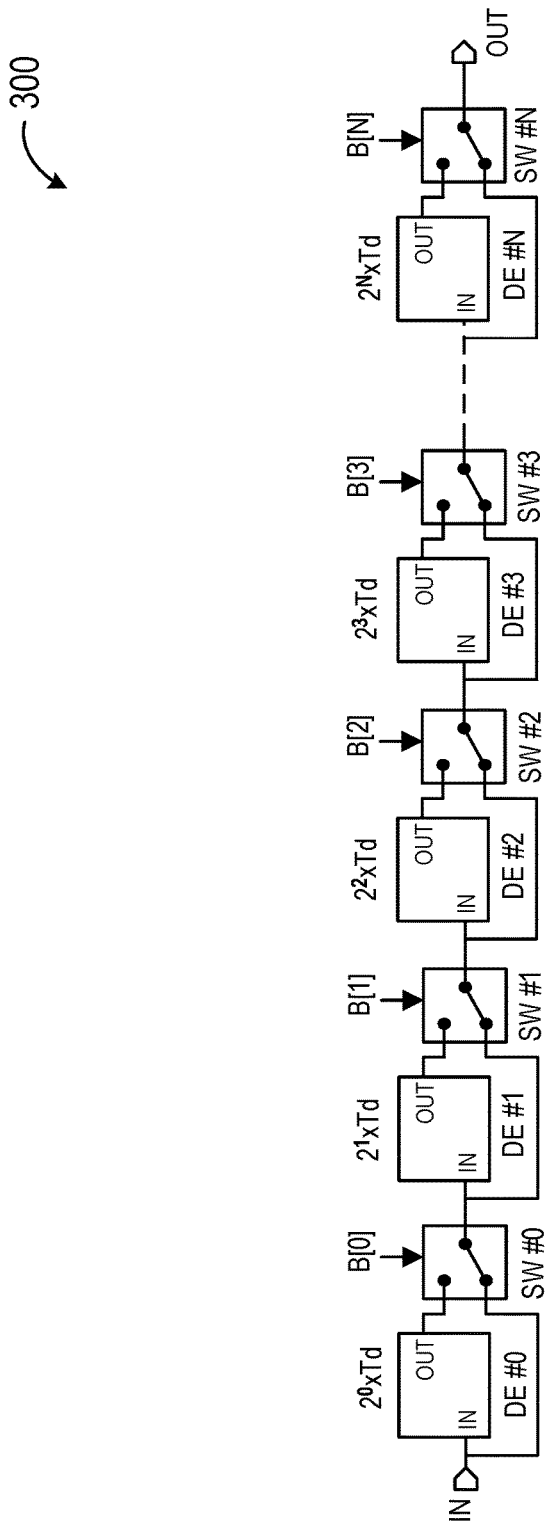
FIG. 3 is a schematic diagram illustrating a digital programmable delay circuit in the clock frequency doubler of FIG. 1 according to some embodiments of the present invention.

FIG. 3 is a schematic diagram illustrating a digital programmable delay circuit in the clock frequency doubler of FIG. 1 according to some embodiments of the present invention. Digital programmable delay circuit 300 in FIG. 3 can be used as digital programmable delay circuits 111 and 112 in FIG. 1. As shown in FIG. 3, digital programmable delay circuit 300 includes N+1 delay elements, DE#0, DE#1, DE#2, DE#3, . . . , and DE#N coupled in series, wherein N is an integer. The N+1 delay elements are controlled by N+1 control bits B[0], [B[1], B[2], B[3], . . . , and B[N], where B[0] is the least significant bit and B[N] is the most significant bit. In some embodiments, the N+1 delay elements are coupled in series with N+1 switches, SW#0, SW#1, SW#2, SW#3 . . . , and SW#N, and each of the switches is controlled by a respective control bit, B[0], [B[1], B[2], B[3], . . . , and B[N], as shown in FIG. 3. Each control bit is configured to select a corresponding delay element in the delay chain. In some embodiments, the switches can be implemented using semiconductor transistors, for example, MOS transistors.

As shown in FIG. 3, delay elements #0, #1, #2, #3, . . . , and #N are configured to provide a time delay of $2^0 \times Td$, $2^1 \times Td$, $2^2 \times Td$, $2^3 \times Td$, . . . , and $2^N \times Td$, respectively. In other words, delay element #0 (DE#0) in the digital programmable delay circuit includes a single delay cell, which is configured to provide a preset delay time Td. For example, the preset delay time Td can be provided by a single delay cell including two inverters. The single delay cell can also be implemented in other circuits as explained below. Delay element #1, DE#1, in the digital programmable delay circuit can include a double delay cell that includes two single delay cells coupled in series. As described above, the single delay cell is configured to provide the preset delay time Td. Similarly, delay element #2, DE#2, in the digital programmable delay circuit includes a quad delay cell that has two double delay cells coupled in series. By extension, delay element #M in the digital programmable delay circuit comprises an M-time delay cell that includes two M/2-time delay cells coupled in series.

In some embodiments, control bits B[0], [B[1], B[2], B[3], ..., and B[N] are bits in a successive approximation register (SAR), and the delay time of the programmable delay circuit can be determined by a time-to-digital converter by successive approximation. In FIG. 3, when input pulse IN goes low, the delay to OUT is set by the switch selected programmed by B[N:0] and is approximately:

$$T\text{delay}1 = B[0] \times Td + B[1] \times 2 \times Td + B[2] \times 4 \times Td + B[3] \times 8 \times Td + \ldots + B[N] \times 2^N \times Td$$

The accuracy of the delay time is within a least significant bit of the control bits B[N:0]. In other words, the accuracy is within one unit of delay Td.

Referring to FIG. 1, clock period to digital converter 160 includes a divide-by-two circuit 140 and a time-to-digital converter (TDC) 150. As shown in FIG. 1, time-to-digital converter (TDC) 150 includes an input node 151 for receiving an input digital signal (K) having a frequency and a period. In this example, the input signal (K) is derived from input clock signal (A) by divide-by-two circuit 140. Therefore, digital signal (K) has a frequency Freq that is half the frequency of the input clock signal (A) and a period Tclock that is twice the period of the input clock signal (A). In some embodiments, divide-by-two circuit 140 can be implemented using a flip-flop with feedback that divides the clock frequency by two. Time-to-digital converter (TDC) 150 has an inverter 151 coupled to the input node for providing an inverse clock signal (L). TDC 150 also has a digital programmable delay circuit 153, which is similar to digital programmable delay circuit 300 in FIG. 3. Digital programmable delay circuit 153 includes N+1 delay elements, numbered #0, #1, #2, #3, ..., and #N, respectively, wherein N is an integer. Delay elements #0, #1, #2, #3, ..., and #N are configured to provide a time delay of $2^0 \times Td$, $2^1 \times Td$, $2^2 \times Td$, $2^3 \times Td$, ..., and $2^N \times Td$, respectively, wherein Td is a preset delay time. Time-to-digital converter (TDC) 150 also has a successive approximation register (SAR) block 155 coupled to the digital programmable delay circuit 153. SAR block 155 includes a successive approximation register (SAR) having N+1 bits, labeled B[0], [B[1], B[2], B[3], ..., and B[N]. Each of the N+1 delay element is selected by a respective bit in the successive approximation register (SAR) B[0], [B[1], B[2], B[3], ..., and B[N], wherein B[0] is the least significant bit and B[N] is the most significant bit of the SAR. The SAR is configured to adjust the bits in the SAR by successive approximation to match the delay time of the digital programmable delay circuit to the width of the input pulse signal to within a least significant bit of the SAR. SAR block 155 also includes a comparator circuit for comparing the incoming clock signal (K) with the delayed inverse clock signal (R). Further, SAR block 155 is coupled to digital programmable delay circuit 153 to updating control bits B[N:0] based on the result of the comparison. Moreover, SAR block 155 also provides output bits TDC [N:0] representing the final value of control bits B[N:0], which can be used in other digital programmable delay circuits. The operation of the successive approximation register time-to-digital converter (SAR TDC) is explained below with reference to the flowchart in FIG. 4.

Figure 4:
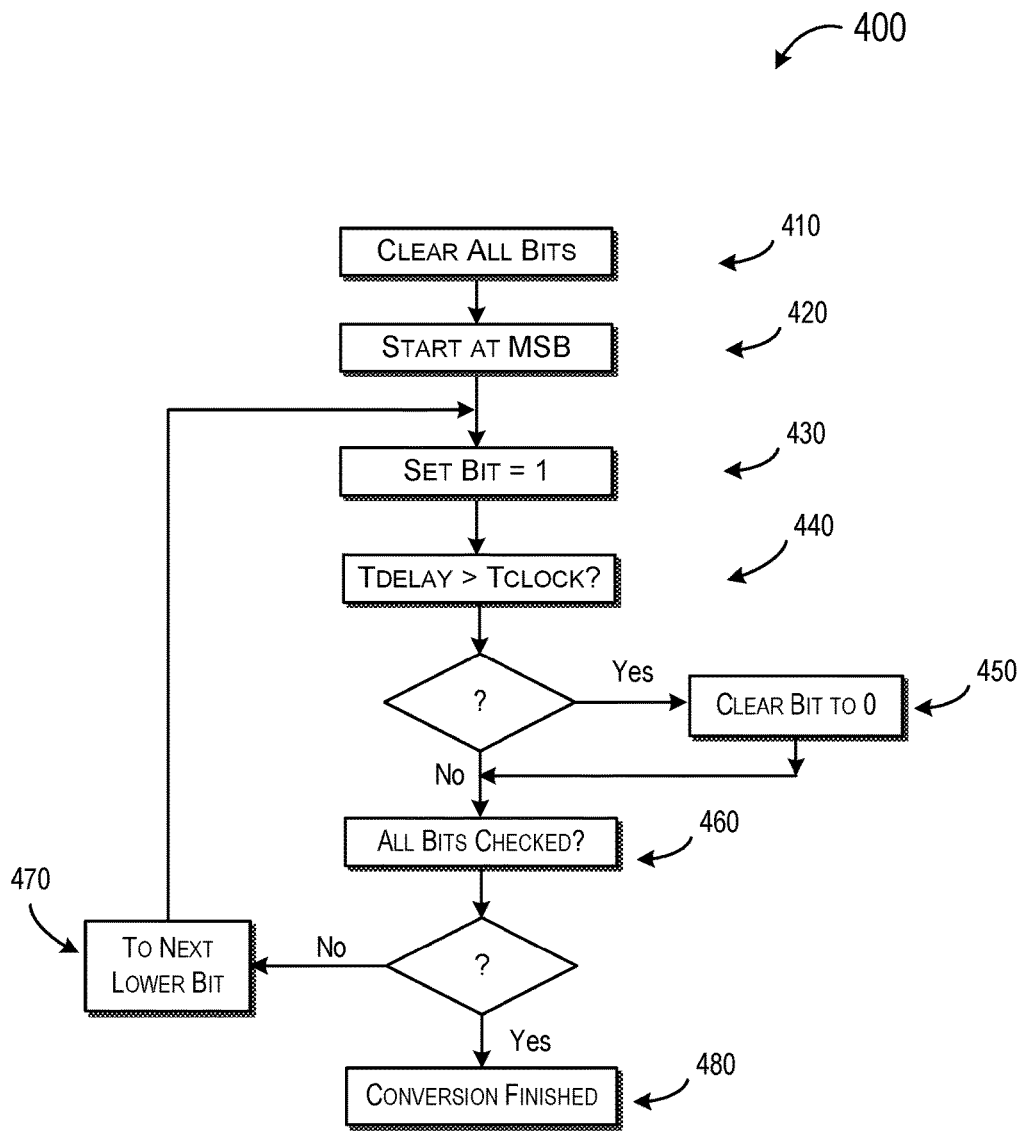
FIG. 4 is a flowchart illustrating the operation of the SAR TDC in the clock frequency doubler of FIG. 1 according to some embodiments of the present invention.

FIG. 4 is a flowchart illustrating the operation of the SAR TDC in the clock frequency doubler of FIG. 1 according to some embodiments of the present invention. As shown in FIG. 4, after clearing all the bits in the successive approximation register (410), a successive approximation method 400 starts with the most significant bit (420) and moves to the least significant bit. In the example of time-to-digital converter (TDC) 150, the most significant bit is B[N]. Next, the selected bit is set to one (1) (430). The delay time in digital programmable delay circuit 153 is compared with inverse of input clock signal (L). If the delay time in the digital programmable delay circuit is too high (450), then the bit is cleared to zero (0). If the delay time in the digital programmable delay circuit is lower than the target (460), the bit remains at one (1). In some embodiments, the comparison can be implemented using a latch. At every other edge of the input clock, the output of the programmable delay cell is latched. Depending on whether it is a '1' or '0', the decision is made (Is Tdelay>Tclock?). Next, the method proceeds to the next bit (470) at the next clock, unless all bits are finished. If all the bits from the most significant bit to the least significant bit are processed, the method is finished (480). At this end of method 400, the result is within a least significant bit of the SAR by successive approximation.

In FIG. 1, time-to-digital converter (TDC) 150 is configured to generate pulses for a 50% duty cycle. First, the input clock (A) is divided by 2 to produce clock signal (K). The divided clock (L) is fed into a Successive Approximation Register Time-to-digital Converter (SAR TDC) 150. The SAR TDC 150 has a digitally programmable delay 153, which is labeled Tdelay4, with 4 times the delay of Tdelay1 that is provided by digitally programmable circuits 111 and 112. The programmable delay Tdelay4 is designed such that it closely tracks Tdelay1. For every cycle of the divided clock the SAR circuit successively sets the programmable delay bits B[N:0] and compares the delay circuit output (R) with the divided input cluck (K) such that after all bits in B[N:0] are determined, the delay of the Tdelay4 block 153 approximates the clock period of the input clock CLOCK_IN. In this case, the delay time of Tdelay4 is approximately:

$$T\text{delay}4 = B[0] \times 4 \times Td + B[1] \times 8 \times Td + B[2] \times 16 \times Td + B[3] \times 32 \times Td + \ldots + B[N] \times 4 \times 2^N \times Td$$

The accuracy of the delay time is within a least significant bit of the control bits B[N:0]. In other words, the accuracy is within one unit of delay 4×Td.

At the end of the conversion, the B[N:0] content is latched into TDC[N:0], which is coupled into the control bits B[N:0] in digitally programmable circuits 111 and 112, and the delay of Tdelay1 will be one fourth of the period of input clock signal Tclock_in/4.

Figure 5A:
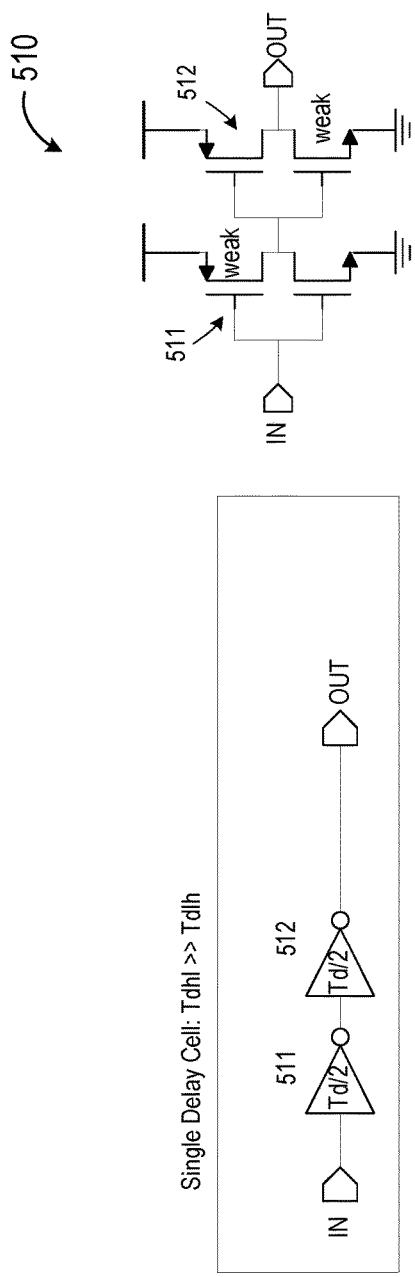
FIGS. 5A-5D are schematic diagrams illustrating various delay elements according to some embodiments of the present invention.

FIGS. 5A-5D are schematic diagrams illustrating various delay elements according to some embodiments of the present invention. Depending on the embodiment, the delay cells in the digital programmable delay circuits described above can be made out of logic gates, or programmable RC networks, or using programmable currents and capacitors. The advantage of logic gates is that they can easily be transferred into different technologies and the programmability (number of bits) can easily be expanded. However, RC networks and capacitor charging networks can be made more accurate, especially when using trimming techniques. FIGS. 5A-5D illustrate examples of delay circuits using logic gates. First, a single delay cell 510 is shown in FIG. 5A. In this case, the intrinsic delay is set by two slow inverters 511 and 512. When the input goes from high to low, the output OUT will go low after a delay of Td, which is a preset delay time, which can be selected based on the specific circuit implementation and application of the clock frequency multiplier. On the right hand side is a circuit diagram illustrating an implementation of the single delay cell using MOS transistors. As noted in FIG. 5A, the single delay cell 510 has a slower high to low transition time Tdh1 than low to high transition time Tdl1h.

Figure 5B:
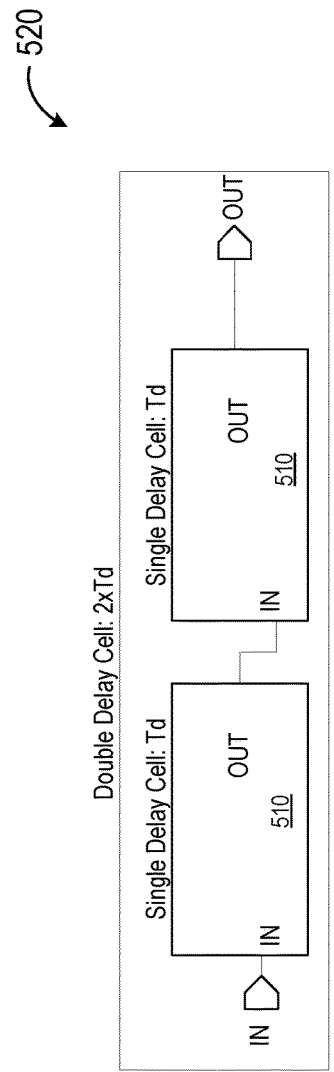
Figure 5C:
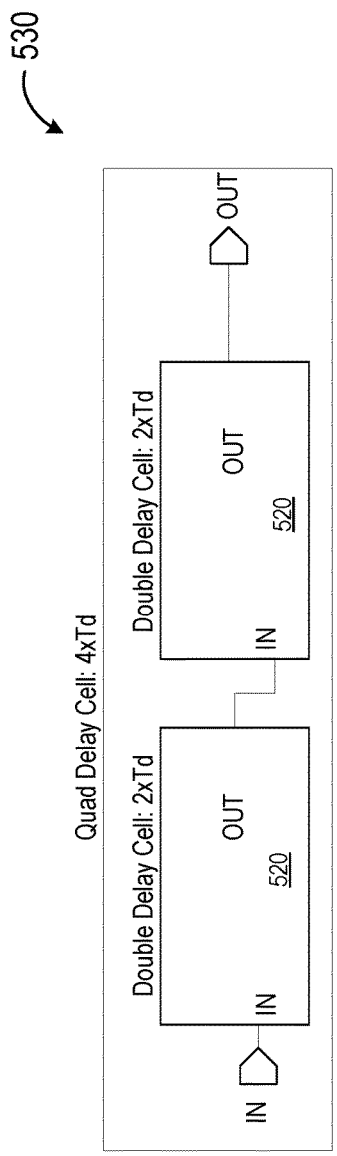
Figure 5D:
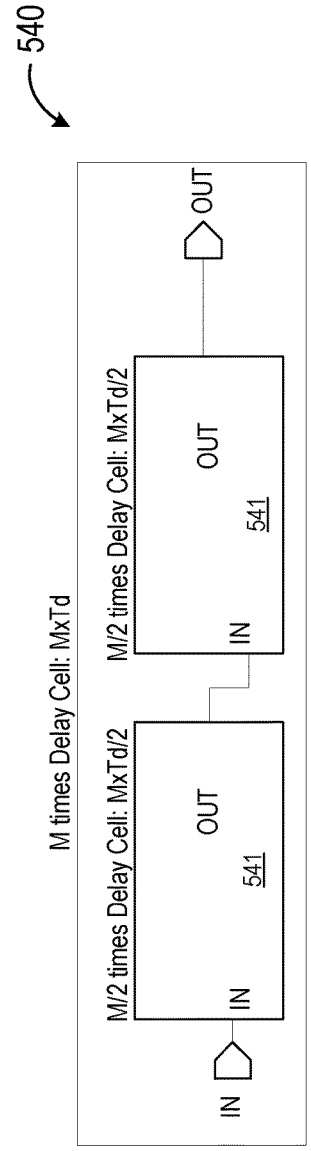

FIG. 5B is a block diagram illustrating a double delay cell 520 with a delay of 2×Td. It can be seen that double delay cell 520 can be implemented by cascading two single delay cells 510. FIG. 5C is a block diagram illustrating a quad delay cell 530 with a delay of 4×Td. It can be seen that quad delay cell 530 can be implemented by cascading two double delay cells 520. FIG. 5D is a block diagram illustrating a quad delay cell 530 with a delay of 4×Td. This can be repeated until a delay cell with a delay of M×Td is reached, where M=$2^N$ and N+1 is the number of SAR TDC bits. FIG. 5D is a block diagram illustrating a M times delay cell 540 with a delay of M×Td. It can be seen that M times delay cell 540 can be implemented by cascading two M/2 delay cells 541.

Figure 6:
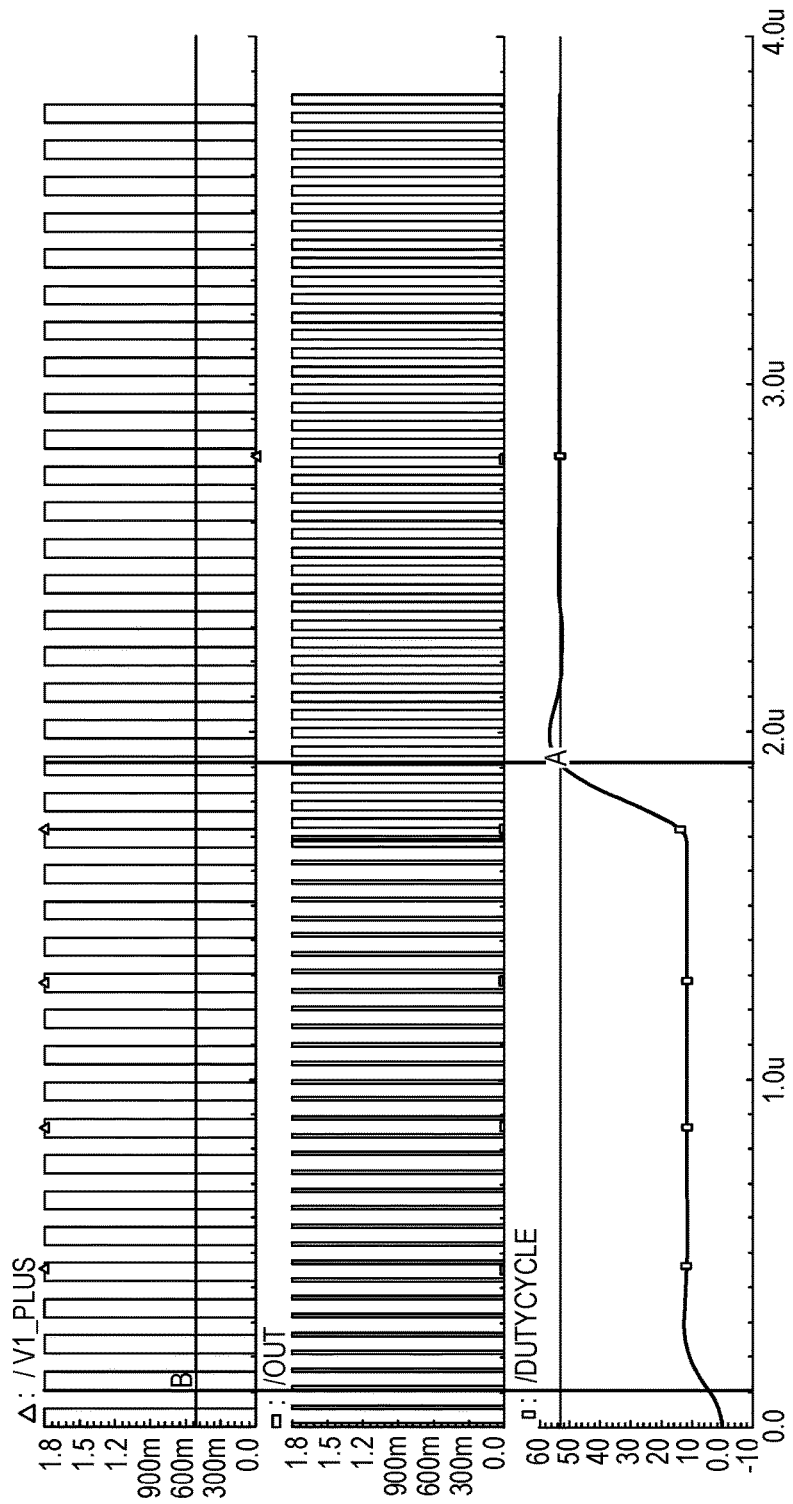
FIG. 6 is a waveform diagram illustrating the successive approximation operation of the clock frequency doubler of FIG. 1 according to some embodiments of the present invention; [How to show]

FIG. 6 is a waveform diagram illustrating a simulation result of the successive approximation operation of the clock frequency doubler of FIG. 1 according to some embodiments of the present invention. This transient response simulation result shows progression of the successive approximation operation to produce an output clock from an input clock 9.6 MHz. It can be seen that the frequency of the output clock signal is twice the frequency of the input clock signal. A separate DUTYCYCLE measurement circuit was used to plot the duty cycle waveform. The measurement circuit includes a filter, which causes the delay and overshoot of the measurement. The DUTYCYCLE achieved is 53%, using an 8 bit SAR. When the SAR converges the first time a few glitches are observed. They could be suppressed by using a SAR conversion indicator to gate the output.

Another simulation was carried out that results in the successive approximation operation of the clock frequency doubler of FIG. 1 according to some embodiments of the present invention. The transient result shows the input clock and output for a 2 MHz input. The DUTYCYCLE achieved is 50.4%, using an 8 bit SAR. The result here is more accurate since the input clock period is larger compared to the unit delay time. When the SAR converges the first time a few glitches are observed again, but the second conversion there is no change in data, so no glitch occurs.

Analysis of certain design considerations and evaluation of circuit performance parameters of the clock frequency multipliers is presented below. Depending on the resolution and range required, the number of bits and unit delays need to be selected. The resolution is:

Resolution=100×Td/(0.5×Tclock)(%)

So, for a 9.6 MHz input clock and a 1.5 nsec Td, the resolution would be 2.88%, and for a 2 MHz input clock and a 1.5 nsec Td, the resolution would be 0.6%, which approximately matches the simulation result.

Range=4×Td×($2^{N+1}$−1)

For an 8 bit SAR with Td=1.5 nsec, the range would be 4×1.5 nsec×255=1.53 usec. The minimum input clock frequency would be 654 kHz. For worst case simulation of the range, one would use the fast case logic simulation corners, while for the worst case resolution simulation, one would use the slow case logic simulation corners.

In terms of jitter, the circuit follows the rising and falling edges of the input waveform exactly. Therefore, it does not filter jitter like a PLL would. In addition, the SAR and delay cells can produce jitters. In cases where an accurate low jitter external clock is supplied, it is better to conduct all signal processing from the edges that are derived from the rising and falling edges of the external clock. The additional advantage of having the SAR result is that it allows readout of the gate delay characteristics of every device if an accurate external clock frequency is used.

Since the delay circuits that provide the pulses are copies of the delay cell used in the SAR ADC, mismatch effects can affect the resulting clock pulse width. Assuming a Gaussian distribution, the mismatch effect can be calculated by:

$$\Sigma T delay 1 = \Sigma Td \times \sqrt{B[0] + B[1] \times 2 + B[2] \times 4 + B[3] \times 8 + \ldots + B[N] \times 2^N}$$

$$\Sigma T delay 1 \sim \Sigma Td \times \sqrt{\left(\frac{Tclock}{4 \times Td}\right)}$$

Therefore, the sigma of the duty cycle then becomes:

$$\Sigma Duty\_cycle(\%) \sim 100 x \Sigma Td \times \sqrt{\left(\frac{1}{Tclock \times Td}\right)}$$

For example in a 0.18 um process a 1.79 nsec delay gate has a sigma of 9.34 psec. At a 9.6 MHz input clock the sigma of the delay chain is then:

$\Sigma T\text{delay}1=9.34$ psec×$\sqrt{14.5}$=35.6 psec $\Sigma$Duty_cycle=0.07%

Figure 7A:
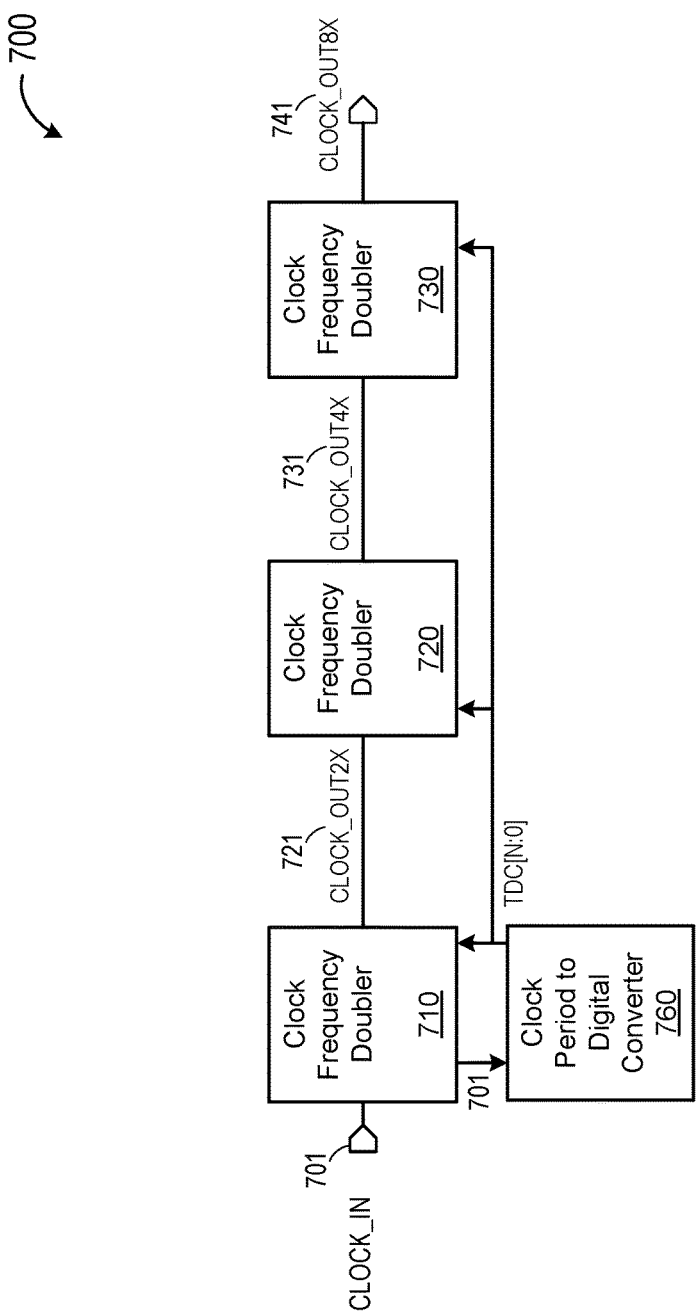
FIGS. 7A-7D are schematic diagrams illustrating a clock frequency multiplier according to some embodiments of the present invention.

FIGS. 7A-7D are schematic diagrams illustrating a clock frequency multiplier according to some embodiments of the present invention. As shown in FIG. 7A, clock frequency multiplier 700 can include frequency doublers 710, 720, and 730 coupled together in a series arrangement. Each of frequency doublers 710, 720, and 730 is also coupled to a clock period to digital converter 760. Each of frequency doublers 710, 720, and 730 is configured to provide an output clock that has twice the frequency as the input clock. For example, frequency doubler 710 receives an input clock signal 701 CLOCK_IN and provides an output clock signal 721 CLOCK_OUT2X, which has twice the clock frequency as input clock signal 701. Similarly, frequency doubler 720 receives input clock signal 721 CLOCK_OUT2X and provides an output clock signal 731 CLOCK_OUT4X, which has four times the clock frequency as input clock signal 701. Further, frequency doubler 730 receives input clock signal 731 CLOCK_OUT4X and provides an output clock signal CLOCK_OUT8X, which has eight times the clock frequency as input clock signal 701. As shown in FIG. 7A, each of frequency doublers 710, 720, and 730 is coupled to clock period to digital converter 760, which receives input clock signal 701 CLOCK_IN and provides parameters for TDC

[N:0] to each of frequency doublers 710, 720, and 730. More details about these circuits are described with reference to FIGS. 7B-7D.

Figure 7B:
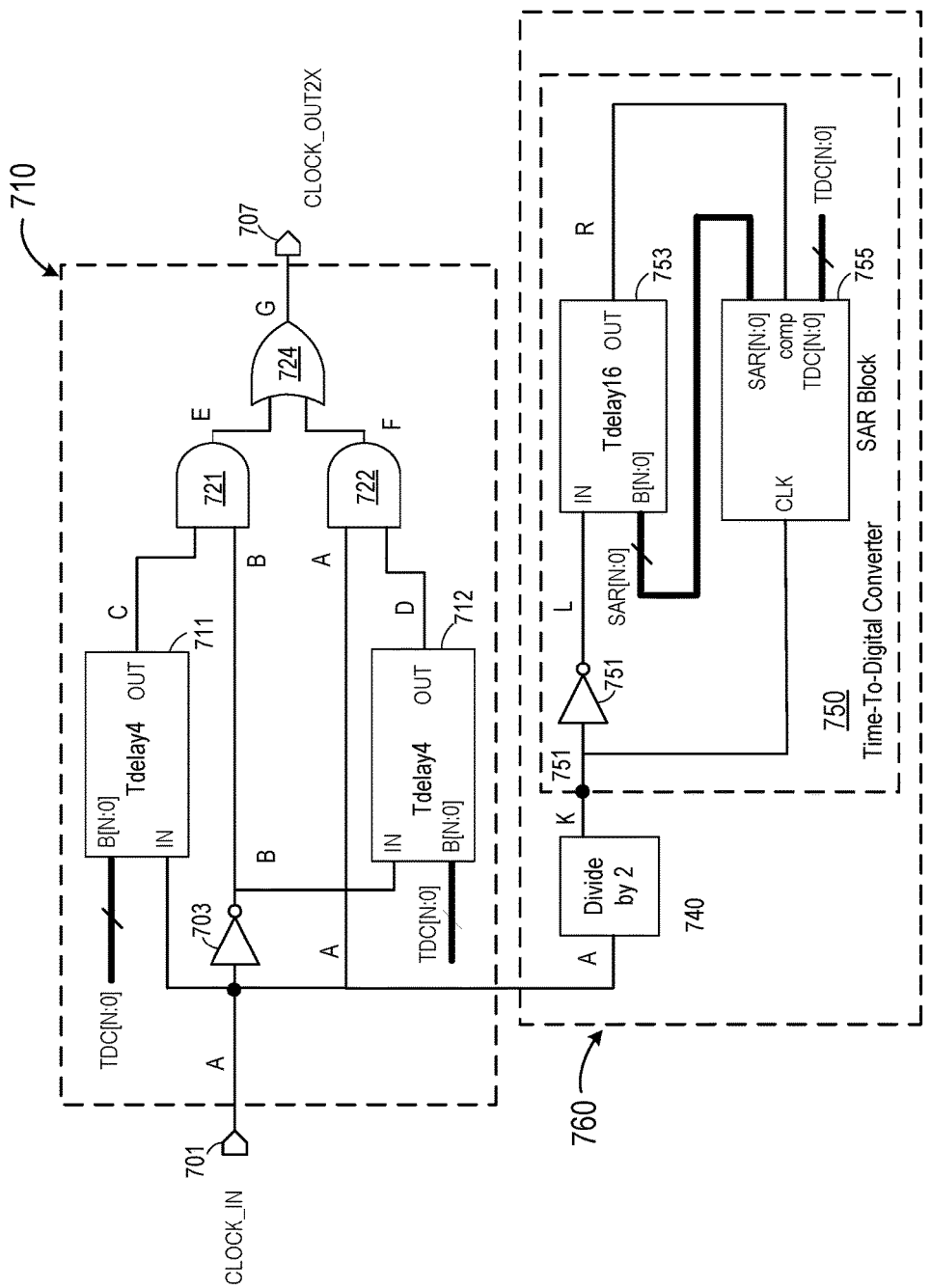

FIG. 7B is a schematic diagram illustrating a clock frequency doubler circuit 710 and a clock period to digital converter 760 according to some embodiments of the present invention. Clock frequency doubler circuit 710 and clock period to digital converter 760 have similar circuit configurations as clock frequency doubler circuit 100 and clock period to digital converter 160 illustrated in FIG. 1. A notable difference is that programmable delay blocks Tdelay1 and Tdelay4 in FIG. 1 are replace by programmable delay blocks Tdelay4 and Tdelay16, respectively.

In FIG. 7B, digital pulse generator or clock frequency doubler 710 includes an input node 701 for receiving an input clock signal CLOCK_IN (A) having a clock frequency Freq and a clock period Tclock. An inverter 703 is coupled to the input node for providing an inverse clock signal (B). A first digital programmable delay circuit 711 is coupled to the input terminal for providing a delayed clock signal (C), and a second digital programmable delay circuit 712 is coupled to the inverter for providing a delayed inverse clock signal (D). Clock frequency doubler 100 also includes a first AND gate 721 for receiving the delayed clock signal (C) and the inverse clock signal (B). The first AND gate outputs a first pulse signal (E). Clock frequency doubler 100 also includes a second AND gate 722 for receiving the input clock signal (A) and the delayed inverse clock signal (D). The second AND gate outputs a second pulse signal (F). Further, an OR gate 724 receives the first pulse signal (E) and the second pulse signal (F), and outputs an output clock signal 707 (CLOCK_OUT2X).

In FIG. 7B, clock period to digital converter 760 includes a divide-by-two circuit 740 and a time-to-digital converter (TDC) 750. Time-to-digital converter (TDC) 750 includes an input node 751 for receiving an input digital signal (K) having a frequency and a period. In this example, the input signal (K) is derived from input clock signal (A) by divide-by-two circuit 740. Therefore, digital signal (K) has a frequency Freq that is half the frequency of the input clock signal (A) and a period Tclock that is twice the period of the input clock signal (A). In some embodiments, divide-by-two circuit 740 can be implemented using a flip-flop with feedback that divides the clock frequency by two. Time-to-digital converter (TDC) 750 has an inverter 751 coupled to the input node for providing an inverse clock signal (L). TDC 750 also has a digital programmable delay circuit 753, which is similar to digital programmable delay circuit 153 in FIG. 1, but includes Tdelay16 elements instead of Tdelay4 elements as in FIG. 1. Time-to-digital converter (TDC) 750 also has a successive approximation register (SAR) block 755 coupled to the digital programmable delay circuit 753. The SAR is configured to adjust the bits in the SAR by successive approximation to match the delay time of the digital programmable delay circuit to the width of the input pulse signal to within a least significant bit of the SAR. Successive approximation register (SAR) block 755 provides parameters TDC[N:0] first digital programmable delay circuit 711 and second digital programmable delay circuit 712 to set a proper delay for the desired output. The operation of clock frequency doubler 710 and clock period to digital converter 760 is similar to that described above in connection with FIGS. 2-6.

Thus, as described above in connection to FIGS. 7A and 7B, frequency doubler 710 and clock period to digital converter 760 receives an input clock signal 701 and provides an output clock signal 721 CLOCK_OUT2X, which has twice the clock frequency as input clock signal 701.

Figure 7C:
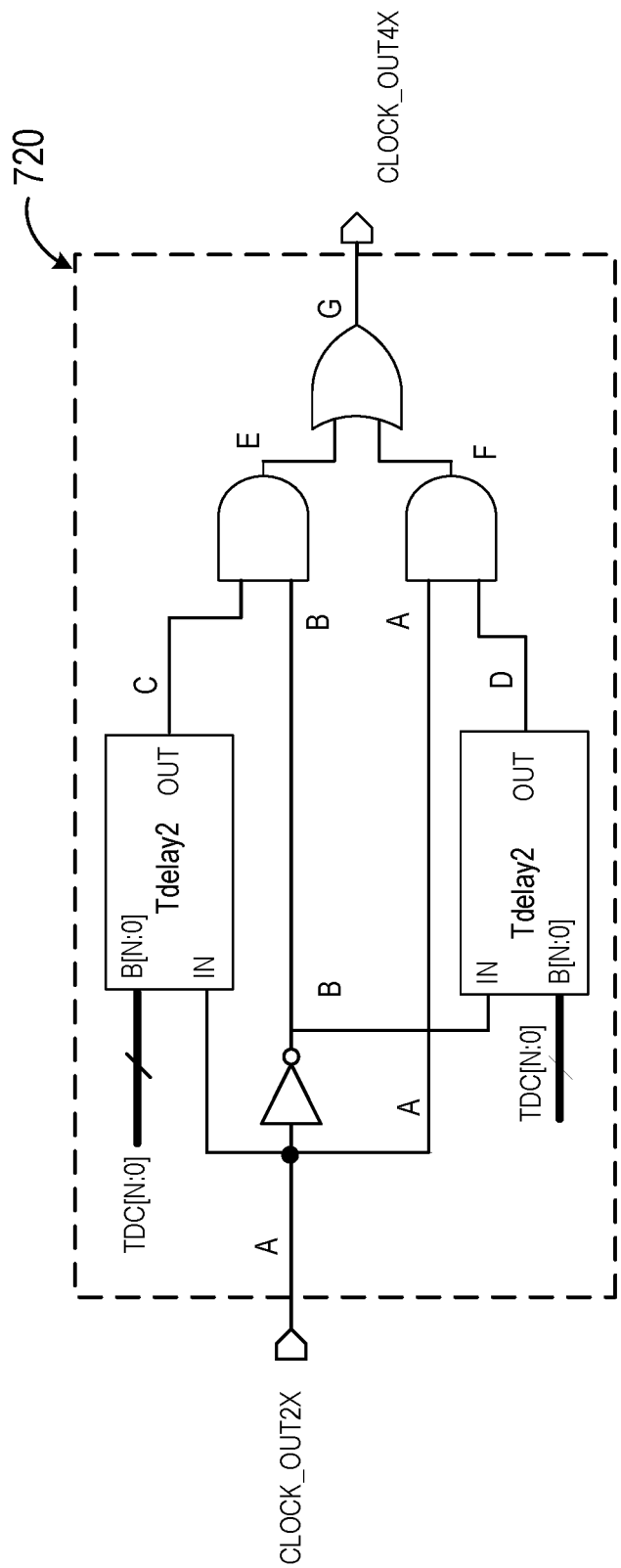

FIG. 7C is a schematic diagram illustrating clock frequency doubler circuit 720 in FIG. 7A according to some embodiments of the present invention. Frequency doubler circuit 720 is similar to frequency doubler circuit 710 in FIGS. 7A and 7B, with digital programmable delay circuits Tdelay4 replaced by digital programmable delay circuits Tdelay2. Together with clock period to digital converter 760 as shown in FIGS. 7A and 7B, frequency doubler 720 receives an input clock signal CLOCK_OUT2X and provides an output clock signal CLOCK_OUT4X, which has four times the clock frequency as input clock signal 701.

Figure 7D:
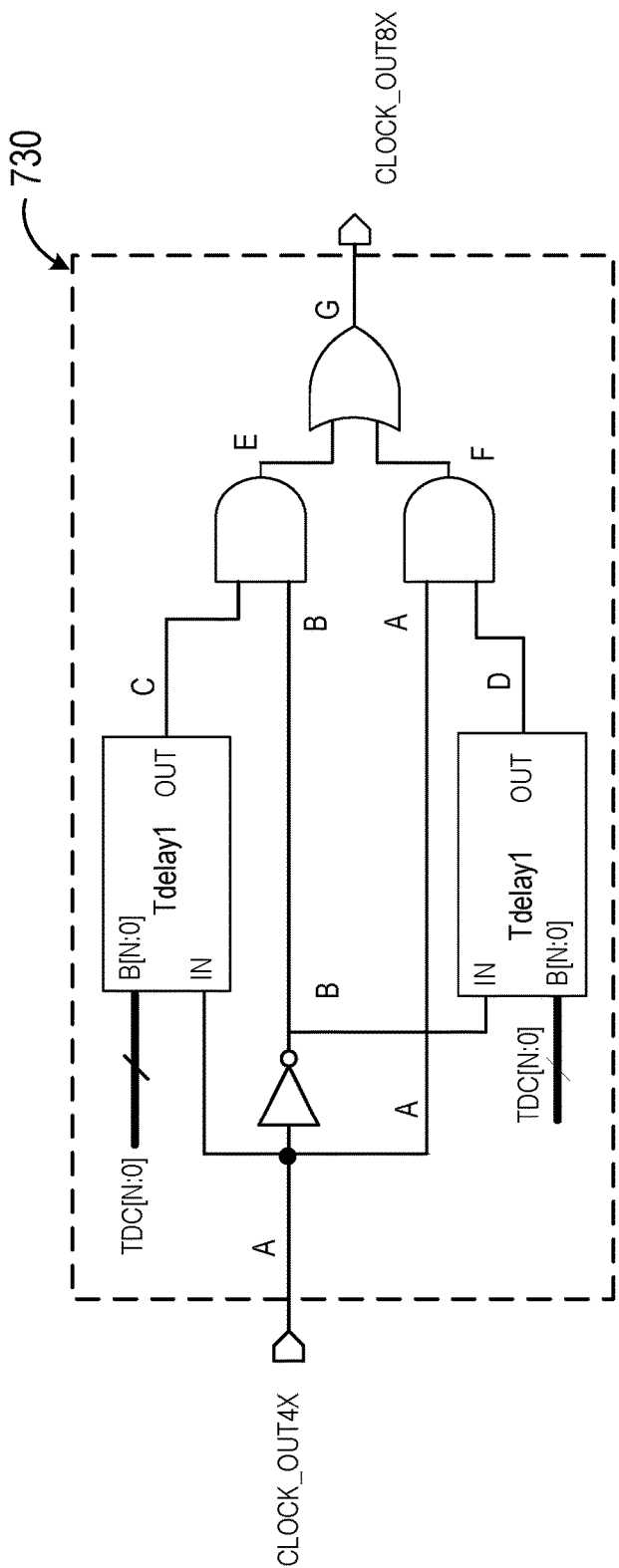

FIG. 7D is a schematic diagram illustrating clock frequency doubler circuit 730 in FIG. 7A according to some embodiments of the present invention. Frequency doubler circuit 730 is similar to frequency doubler circuit 710 in FIG. 7A, with digital programmable delay circuits Tdelay4 replaced by digital programmable delay circuits Tdelay1. Together with clock period to digital converter 760 as shown in FIGS. 7A and 7B, frequency doubler 730 receives an input clock signal CLOCK_OUT4X and provides an output clock signal CLOCK_OUT8X, which has eight times the clock frequency as input clock signal 701.

Figure 8:
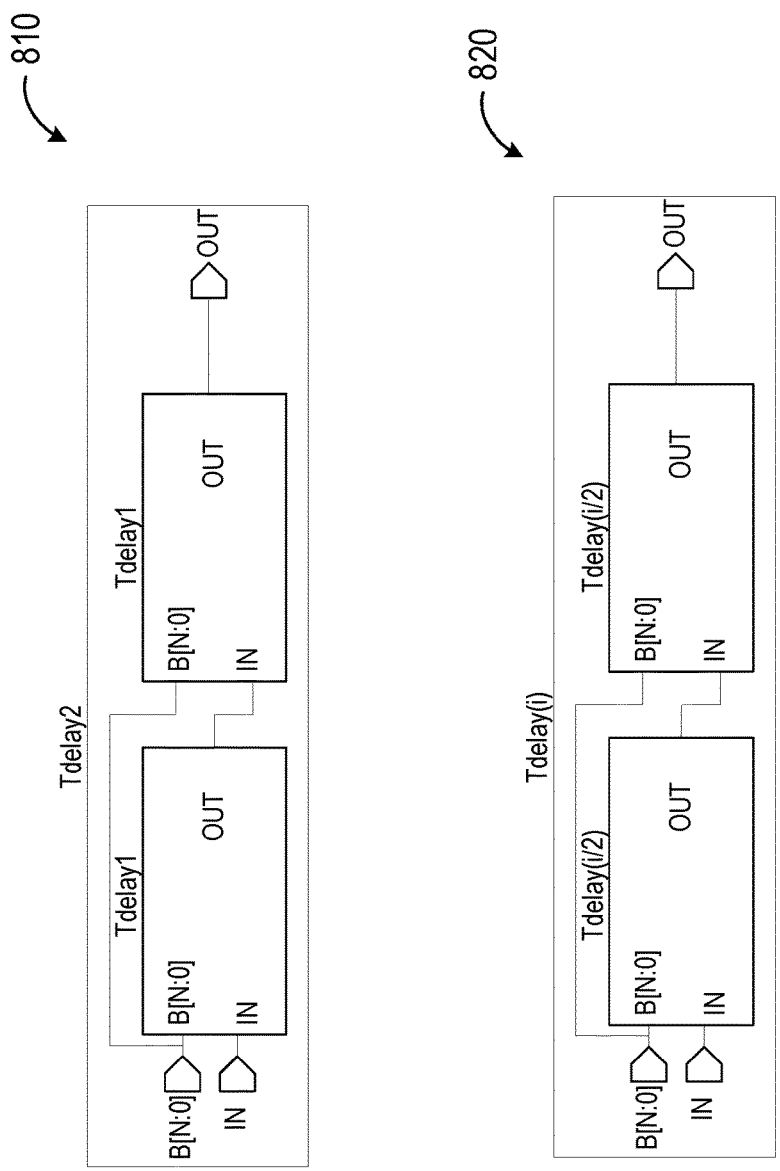
FIG. 8 is a schematic diagram illustrating various digital programmable delay circuits that can be used in a clock frequency multiplier according to some embodiments of the present invention.

FIG. 8 is a schematic diagram illustrating examples of digital programmable delay circuits that can be used in circuit blocks in FIGS. 7A-7D according to some embodiments of the present invention. As shown in FIG. 8, a digital programmable delay circuit 810 (Tdelay2) can be formed with two digital programmable delay circuits Tdelay1 coupled in series. The structure and function of digital programmable delay circuit Tdelay1 is described above in connection with FIG. 3. FIG. 8 also illustrates a digital programmable delay circuit 820 (Tdelay(i)) formed with two digital programmable delay circuits Tdelay(½) coupled in series. For example, a Tdelay4 can be formed with two digital programmable delay circuits Tdelay2 coupled in series. Similarly, a Tdelay8 can be formed with two digital programmable delay circuits Tdelay4 coupled in series, and a Tdelay16 can be formed with two digital programmable delay circuits Tdelay8 coupled in series.

The frequency multiplier circuit described above can be extended to produce an output clock signal that can have a higher frequency than the input clock signal. The clock frequency multiplier can include multiple frequency doublers coupled together in a series arrangement. Each of frequency doublers is coupled to a clock period to digital converter and is configured to provide an output clock that has twice the frequency as the input clock. The digital programmable delay circuits in these circuit blocks can be arranged according to the examples described in connection with FIGS. 7A-7D and FIG. 8.

In some of the embodiments described above, a digital programmable delay circuit is configured to provide a delay of ¼ of the period of the input clock signal, which is useful in generating an output clock signal at twice the frequency of the input clock signal and a 50% duty cycle. In some embodiments, the input clock has a 50% of duty cycle. However, the invention can be used to provide clock frequency multipliers with different desired duty cycle. For example, the time-to-digital converter can be modified according to the target duty cycle. In some cases, divide-by-two circuit can be changed to a divide-by-m circuit, where m is an integer. Further, the digital programmable delay circuit can be modified to provide ½ of the period of the input clock signal, ⅛ of the period of the input clock signal, 1/16 of the period of the input clock signal, etc. In these cases, delay time in the unit delay element in the time-to-digital converter can be changed for different applications.

Even though embodiments of the invention have been described using various specific examples, it is understood that numerals modifications can be made to the embodiments within the purview of the invention. It is also understood that various device, circuit, or logic components in the above examples can be replaced by equivalent alternative components known to those of ordinary skills in the art. For example, where a component such as an AND gate, an OR gate, an inverter, or a switch is used in the above examples, it is understood that these logic elements can be implemented in different circuits that provide a logic AND operation of two input signals, a logic OR operation of two input signals, an logic inversion operation of an input signal, or a switching or selection operation from two or more input signals, respectively. These components, as well as other components, in the above examples can be implemented using various semiconductor devices, such as MOS, CMOS, or bipolar devices.

While the above is a description of specific embodiments of the invention, the description should not be taken as limiting the scope of the invention. It is understood that the examples and embodiments described herein are for illustrative purposes only and that various modifications or changes can be made in light thereof.

What is claimed is:

1. A clock frequency doubling circuit, comprising:
an input node for receiving an input clock signal having a clock frequency Freq and a clock period Tclock_in;
an inverter coupled to the input node for providing an inverse clock signal;
a first digital programmable delay circuit coupled to the input terminal for providing a delayed clock signal;
a second digital programmable delay circuit coupled to the inverter for providing a delayed inverse clock signal;
a first AND gate for receiving the delayed clock signal and the inverse clock signal, the first AND gate configured to output a first pulse signal;
a second AND gate for receiving the input clock signal and the delayed inverse clock signal, the second AND gate configured to output a second pulse signal;
an OR gate for receiving the first pulse signal and the second pulse signal, the OR gate configured to output an output clock signal;
a divide-by-two circuit coupled to the input clock signal (A) to provide a second clock signal (K) having a frequency ½×Freq and a period 2×Tclock_in; and
a time-to-digital converter (TDC); coupled to the divide-by-two circuit;
wherein each of the first and second digital programmable delay circuits includes N+1 delay elements and N+1 switches coupled in series, wherein N is an integer,
wherein delay elements #0, #1, #2, #3, . . . , and #N of the N+1 delay elements are configured to provide a time delay of $2^0 \times Td$, $2^1 \times Td$, $2^2 \times Td$, $2^3 \times Td$, . . . , and $2^N \times Td$, respectively, wherein Td is a preset delay time, and each of the N+1 delay element is selected by a corresponding one of N+1 control bits B[N:0], labeled B[0], [B[1], B[2], B[3], . . . , and B[N], wherein B[0] is the least significant bit and B[N] is the most significant bit;
wherein the time-to-digital converter is configured to determine values of the control bits B[N:0] by successive approximation so that the delay times of the first and second digital programmable delay circuits are equal to ¼ of the input clock period Tclock_in to within an accuracy of Td.

2. The circuit of claim 1, wherein the time-to-digital converter comprises:
an input node for receiving the second clock signal (K);
an inverter coupled to the input node for providing an inverse clock signal;
a digital programmable delay circuit, wherein:
the digital programmable delay circuit includes N+1 delay elements, numbered #0, #1, #2, #3, . . . , and #N, respectively, wherein N is an integer;
wherein delay elements #0, #1, #2, #3, . . . , and #N are configured to provide a time delay of $2^0 \times 4 \times Td$, $2^1 \times 4 \times Td$, $2^2 \times 4 \times Td$, $2^3 \times 4 \times Td$, . . . , and $2^N \times 4 \times Td$, respectively; and
a successive approximation register (SAR) coupled to the digital programmable delay circuit, the SAR including N+1 bits, labeled B[0], [B[1], B[2], B[3], . . . , B[N], respectively;
wherein each of the N+1 delay elements is selected by a respective bit in the successive approximation register (SAR) B[0], [B[1], B[2], B[3], . . . , B[N], wherein B[0] is the least significant bit and B[N] is the most significant bit of the SAR;
wherein the SAR is configured to adjust the bits in the SAR by successive approximation to match the delay time of the digital programmable delay circuit to the period Tclock_in of the input pulse signal to within a least significant bit of the SAR.

3. The circuit of claim 2, wherein the time-to-digital converter is configured to:
clear all bits in the successive approximation register;
select the most significant bit in the SAR;
determine a value of the selected bit, by the following operation:
set the selected bit to a logic "1";
determine if the delay time in the digital programmable delay circuit is greater than the period of the input digital signal;
if the delay time is higher than the period of the input signal, set the selected bit to a logic "0";
if the delay time is not higher than the period of the input signal, leave the selected bit at logic "1";
determine a value of the next significant bit, until all bits in the SAR are processed.

4. The circuit of claim 1, wherein the preset delay time Td is provided by a single delay cell comprising two inverters.

5. The circuit of claim 1, wherein each of the first and second digital programmable delay circuits further comprises N+1 switches, each coupled to a respective one of the N+1 delay elements, wherein each of the N+1 switches is controlled by a respective bit in the SAR.

6. The circuit of claim 1, further comprising an output terminal for providing an output clock signal having a clock frequency of 2×Freq.

7. The circuit of claim 1, further comprising an output terminal for providing an output clock signal having a duty cycle of 50%.

8. The circuit of claim 1, further comprising an output terminal for providing an output clock signal having a duty cycle of 50% to within a least significant bit of the SAR.

9. A digital pulse generation circuit, comprising:
a pulse generator for receiving an input node for receiving an input clock signal having a clock frequency Freq and a clock period Tclock_in, wherein the pulse generator includes a digital programmable delay circuit having a plurality of control bits to provide a delay time that is a preset fraction of the input clock signal; and a successive approximation register (SAR) for determining values of the plurality of control bits.

10. The circuit of claim 9, wherein the pulse generator comprises:

an inverter coupled to the input node for providing an inverse clock signal;

a first digital programmable delay circuit coupled to the input terminal for providing a delayed clock signal;

a second digital programmable delay circuit coupled to the inverter for providing a delayed inverse clock signal;

a first AND gate for receiving the delayed clock signal and the inverse clock signal, the first AND gate configured to output a first pulse signal;

a second AND gate for receiving the input clock signal and the delayed inverse clock signal, the second AND gate configured to output a second pulse signal; and an OR gate for receiving the first pulse signal and the second pulse signal, the OR gate configured to output an output clock signal;

wherein each of the first and second digital programmable delay circuit includes N+1 delay elements and N+1 control bits configured for controlling the N+1 delay elements, wherein N is an integer;

wherein the N+1 control bits are configured to match the delay time of the digital programmable delay circuit to a preset fraction of the clock period Tclock_in.

11. The clock frequency doubler of claim 9, further comprising a time-to-digital converter (TDC), wherein the time-to-digital converter is configured to determine values of the N+1 control bits by successive approximation so that the delay times of the first and second digital programmable delay circuits are equal to the preset fraction of the input clock period Tclock_in.

12. A clock frequency multiplier circuit, comprising two or more clock frequency doublers coupled in series, wherein each clock frequency doubler comprises:

an input node for receiving an input clock signal having a clock frequency Freq and a clock period Tclock;

an inverter coupled to the input node for providing an inverse clock signal;

a first digital programmable delay circuit coupled to the input terminal for providing a delayed clock signal;

a second digital programmable delay circuit coupled to the inverter for providing a delayed inverse clock signal;

a first AND gate for receiving the delayed clock signal and the inverse clock signal, the first AND gate configured to output a first pulse signal;

a second AND gate for receiving the input clock signal and the delayed inverse clock signal, the second AND gate configured to output a second pulse signal;

an OR gate for receiving the first pulse signal and the second pulse signal, the OR gate configured to output an output clock signal;

wherein each of the first and second digital programmable delay circuit includes N+1 delay elements and N+1 control bits configured for controlling the N+1 delay elements, wherein N is an integer;

wherein the clock frequency doubler further comprises a the time-to-digital converter is configured to determine values of the N+1 control bits by successive approximation so that the delay times of the first and second digital programmable delay circuits are equal to preset fractions of the input clock period Tclock_in to within an accuracy of a least significant bit of the N+1 control bit.

13. The clock frequency multiplier circuit of claim 12, wherein delay elements #0, #1, #2, #3, . . . , and #N of the N+1 delay elements in each of the first and second digital programmable delay circuits are configured to provide a time delay of $2^0 \times Td$, $2^1 \times Td$, $2^2 \times Td$, $2^3 \times Td$, . . . , and $2^N \times Td$, respectively, wherein Td is a preset delay time, and each of the N+1 delay element is selected by a corresponding one of N+1 control bits B[N:0], labeled B[0], [B[1], B[2], B[3], . . . , and B[N], wherein B[0] is the least significant bit and B[N] is the most significant bit.

14. The clock frequency multiplier circuit of claim 12, wherein each of the first and second digital programmable delay circuits further comprises N+1 switches, each coupled to a respective one of the N+1 delay elements, wherein each of the N+1 switches is controlled by a respective bit in N+1 control bits.

15. A time-to-digital converter (TDC), comprising:

an input node for receiving an input digital signal having and a period T;

an inverter coupled to the input node for providing an inverse clock signal;

a digital programmable delay circuit, wherein:

the digital programmable delay circuit includes N+1 delay elements, numbered #0, #1, #2, #3, . . . , and #N, respectively, wherein N is an integer;

wherein delay elements #0, #1, #2, #3, . . . , and #N are configured to provide a time delay of $2^0 \times Td$, $2^1 \times Td$, $2^2 \times Td$, $2^3 \times Td$, . . . , and $2^N \times Td$, respectively, wherein Td is a preset delay time; and a successive approximation register (SAR) coupled to the digital programmable delay circuit, the SAR including N+1 bits, labeled B[0], [B[1], B[2], B[3], . . . , B[N], respectively;

wherein each of the N+1 delay elements is selected by a respective bit in the successive approximation register (SAR) B[0], [B[1], B[2], B[3], . . . , B[N], wherein B[0] is the least significant bit and B[N] is the most significant bit of the SAR;

wherein the SAR is configured to adjust the bits in the SAR by successive approximation to match the delay time of the digital programmable delay circuit to the period T of the input pulse signal to within a least significant bit of the SAR.

16. The time-to-digital converter of claim 15, wherein the time-to-digital converter is configured to:

clear all bits in the successive approximation register;

select the most significant bit in the SAR;

determine a value of the selected bit, by the following operation:

set the selected bit to a logic "1";

determine if the delay time in the digital programmable delay circuit is greater than the period of the input digital signal;

if the delay time is higher than the period of the input signal, set the selected bit to a logic "0";

if the delay time is not higher than the period of the input signal, leave the selected bit at logic "1";

determine a value of the next significant bit, until all bits in the SAR are processed.

17. The time-to-digital converter of claim 15, further comprising N+1 switches, each coupled to a respective one of the N+1 delay elements, wherein each of the N+1 switches is controlled by a respective bit in the SAR.

18. The time-to-digital converter of claim 15, wherein the preset delay time Td is provided by a single delay cell comprising two inverters.

19. The time-to-digital converter of claim 15, wherein delay element #0 in the digital programmable delay circuit comprises a single delay cell, the single delay cell being configured to provide the preset delay time Td.

20. The time-to-digital converter of claim 19, wherein delay element #1 in the digital programmable delay circuit comprises a double delay cell that includes two single delay cells coupled in series, the single delay cell being configured to provide the preset delay time Td.

21. The time-to-digital converter of claim 20, wherein delay element #2 in the digital programmable delay circuit comprises a quad delay cell that includes two double delay cells coupled in series.

22. The time-to-digital converter of claim 21, wherein delay element #M in the digital programmable delay circuit comprises an M-time delay cell that includes two M/2-time delay cells coupled in series.

23. A time-to-digital converter (TDC), comprising:
a digital programmable delay circuit, wherein the digital programmable delay circuit includes N+1 delay elements, numbered #0, #1, #2, #3, . . . , and #N, respectively, wherein N is an integer; and
a successive approximation register (SAR) coupled to the digital programmable delay circuit, the SAR including N+1 bits, labeled B[0], [B[1], B[2], B[3], . . . , and B[N], respectively;
wherein each of the N+1 delay elements is selected by a respective bit in the successive approximation register (SAR) B[0], [B[1], B[2], B[3], . . . , B[N], wherein B[0] is the least significant bit and B[N] is the most significant bit of the SAR;
wherein the time-to-digital converter is configured to adjust the bits in the SAR by successive approximation to match the delay time of the digital programmable delay circuit to the width of the input pulse signal to within a least significant bit of the SAR.

24. The time-to-digital converter of claim 23, wherein delay elements #0, #1, #2, #3, . . . , and #N are configured to provide a time delay of $2^0 \times Td$, $2^1 \times Td$, $2^2 \times Td$, $2^3 \times Td$, . . . , and $2^N \times Td$, respectively, wherein Td is a preset delay time.

* * * * *